(12) United States Patent
Su et al.

(10) Patent No.: US 10,644,701 B1
(45) Date of Patent: May 5, 2020

(54) INPUT AND OUTPUT CIRCUIT AND SELF-BIASED CIRCUIT THEREOF

(71) Applicant: Faraday Technology Corp., Hsinchu (TW)

(72) Inventors: Huang-Shiang Su, Hsinchu (TW); Chi-Sheng Liao, Hsinchu (TW); Jeng-Huang Wu, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 16/566,887

(22) Filed: Sep. 11, 2019

(30) Foreign Application Priority Data

May 21, 2019 (TW) .............................. 108117426 A

(51) Int. Cl.
*H03K 19/003* (2006.01)
*H03K 19/007* (2006.01)
*H03K 3/356* (2006.01)

(52) U.S. Cl.
CPC ..... *H03K 19/007* (2013.01); *H03K 3/356113* (2013.01); *H03K 19/00315* (2013.01)

(58) Field of Classification Search
CPC ....... H03K 3/356113; H03K 19/00315; H03K 19/007
USPC ........................................................ 327/534
See application file for complete search history.

(56) References Cited

U.S. PATENT DOCUMENTS

| 6,184,700 | B1 | 2/2001 | Morris |
| 6,294,943 | B1 | 9/2001 | Wall et al. |
| 7,746,124 | B2 | 6/2010 | Ajit |
| 7,986,171 | B2 | 7/2011 | Wang et al. |
| 9,425,793 | B2 | 8/2016 | Park et al. |
| 9,768,768 | B2 * | 9/2017 | Pan ................... H03K 19/00361 |
| 2008/0068050 | A1 | 3/2008 | Ajit |
| 2012/0049939 | A1 * | 3/2012 | Maede ............... H03K 19/0185 327/537 |
| 2015/0326224 | A1 * | 11/2015 | Park ................. H03K 19/00361 327/361 |

OTHER PUBLICATIONS

"Office Action of Taiwan Counterpart Application", dated Jul. 15, 2019, p. 1-p. 4.

* cited by examiner

*Primary Examiner* — William Hernandez
(74) *Attorney, Agent, or Firm* — Winston Hsu

(57) ABSTRACT

An input output circuit and a self-biased circuit are provided. The self-biased circuit includes a tracking circuit, a biasing control circuit and first to fourth transistors. The tracking circuit receives a first power voltage, and generates a bias voltage according to variation of the first power voltage. The biasing control circuit generates a first control signal, a second control signal and a third control signal according to the first power voltage and a voltage on a pad. The first transistor is coupled to the pad and controlled by the first control signal. The second transistor is controlled by the second control signal to provide a bias voltage. The third transistor is coupled to the pad and controlled by the third control signal and generates a fourth control signal according to the voltage on the pad. The fourth transistor is controlled by the fourth control signal to generate the bias voltage.

11 Claims, 3 Drawing Sheets

INPUT AND OUTPUT CIRCUIT AND SELF-BIASED CIRCUIT THEREOF

CROSS-REFERENCE TO RELATED APPLICATION

This application claims the priority benefit of Taiwan application serial no. 108117426, filed on May 21, 2019. The entirety of the above-mentioned patent application is hereby incorporated by reference herein and made a part of this specification.

BACKGROUND

Technical Field

The invention relates to an input and output circuit and a self-biased circuit thereof, and particularly relates to an input and output circuit supporting a fail-safe mode and a self-biased circuit thereof.

Description of Related Art

In an integrated circuit, in order to implement signal transmission between a chip internal circuit and external, a so-called input and output circuit is often provided as a communication interface between the chip internal circuit and the external. In the conventional technical field, a so-called fail-safe input and output circuit is provided. Such fail-safe input and output circuit may stably guide a connected system to a safe mode in case of power down without causing a collapse or a large electric leakage.

SUMMARY

The invention is directed to an input and output circuit and a self-biased circuit thereof, which are capable of stably controlling levels of internal voltages of the input and output circuit in case of system failure.

The invention provides a self-biased circuit including a tracking circuit, a biasing control circuit and first to fourth transistors. The tracking circuit receives a first power voltage, and generates a bias voltage according to a variation of the first power voltage. The biasing control circuit is coupled to a pad and receives the first power voltage, and generates a first control signal, a second control signal and a third control signal according to the first power voltage and a voltage on the pad. The first transistor is coupled between the pad and a first node, and is controlled by the first control signal. The second transistor is coupled between the first node and a second node, and is controlled by the second control signal, wherein the second node provides the bias voltage. The third transistor has a first terminal coupled to the pad, a control terminal of the third transistor receives the third control signal, and the third transistor generates a fourth control signal at a second terminal of the third transistor according to the voltage on the pad and the third control signal. The fourth transistor is coupled between the tracking circuit and the second node, and the fourth transistor generates the bias voltage on the second node according to the fourth control signal.

The invention provides an input and output circuit including an input output buffer and the aforementioned self-biased circuit. The input output buffer has a plurality of stacked transistors. The self-biased circuit provides the bias voltage to bulks or control terminals of a part of the stacked transistors.

According to the above description, the self-biased circuit of the invention is capable of generating the bias voltage according to a voltage variation state of the first power voltage and the voltage on the pad, and provides the bias voltage to a bulk (formed at an N-well) of each P-type transistor in an integrated circuit. By isolating the bulk of the P-type transistor from the first power voltage, the fail-safe is achieved.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
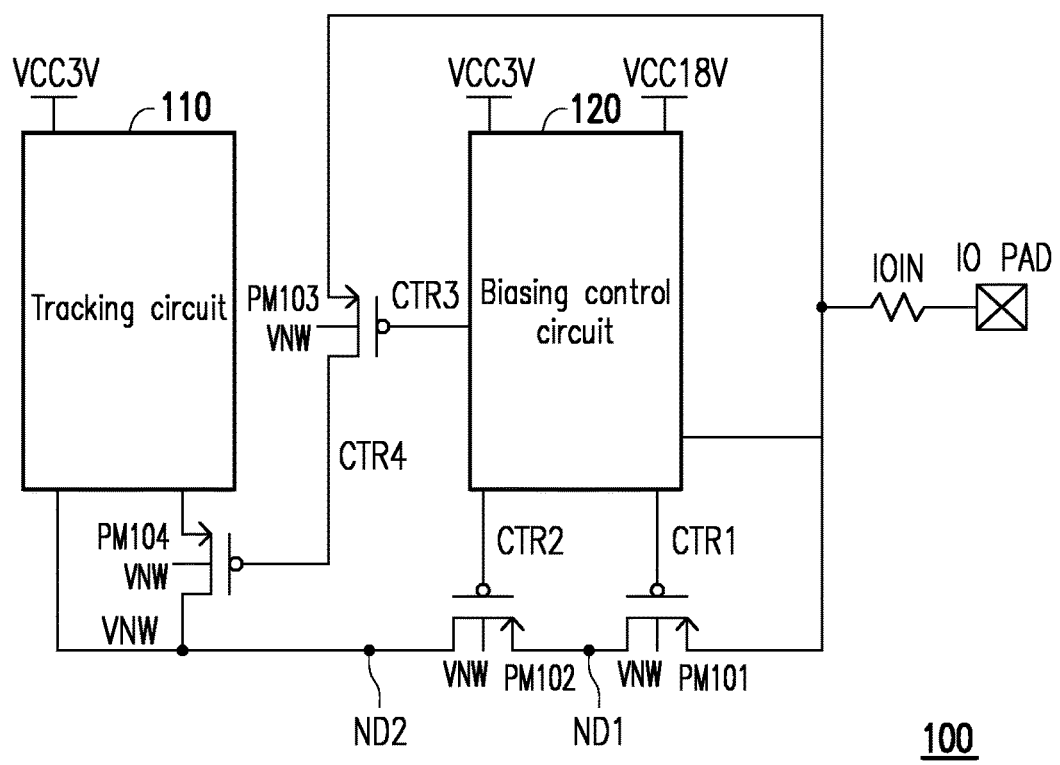
FIG. 1 is a schematic diagram of a self-biased circuit according to an embodiment of the invention.

Referring to FIG. 1, FIG. 1 is a schematic diagram of a self-biased circuit according to an embodiment of the invention. The self-biased circuit 100 includes a tracking circuit 110, a biasing control circuit 120 and transistors PM101-PM04. The tracking circuit 110 receives a first power voltage VCC3V, and generates a bias voltage VNW according to a variation of the first power voltage VCC3V. The tracking circuit 110 is further coupled to a first terminal and a second terminal of the transistor PM104, and provides a voltage to the first terminal of the transistor PM104 according to the bias voltage VNW.

Moreover, the biasing control circuit 120 is coupled to a pad IOPAD and receives the first power voltage VCC3V and a second power voltage VCC18V. The biasing control circuit 120 generates a first control signal CTR1, a second control signal CTR2 and a third control signal CTR3 according to the first power voltage VCC3V, the second power voltage VCC18V and a voltage IOIN on the pad IOPAD. The biasing control circuit 120 respectively provides the first control signal CTR1, the second control signal CTR2 and the third control signal CTR3 to control terminals of the transistors PM101, PM102 and PM103. The pad IOPAD may be an input and output pad.

On the other hand, a first terminal of the transistor PM101 is coupled to the pad IOPAD, and a second terminal of the transistor PM101 is coupled to a first node ND1. A first terminal of the transistor PM102 is coupled to the first node ND1, and a second terminal of the transistor PM102 is coupled to a second node ND2. Moreover, a first terminal of the transistor PM103 is coupled to the pad IOPAD, and a second terminal of the transistor PM103 is coupled to the control terminal of the transistor PM104. The transistor PM103 generates a fourth control signal CTR4 based on the voltage IOIN on the pad IOPAD according to the third control signal CTR3. The transistor PM104 generates the bias voltage VNW based on the signal provided by the tracking circuit 110 according to the fourth control signal CTR4.

It should be noted that in the embodiment, the transistors PM101-PM104 are all P-type transistors, and bulks of the transistors PM101-PM104 commonly receive the bias voltage VNW. In the embodiment, the bulks of the transistors PM101-PM104 may be formed on an N-well of a chip.

Figure 2:
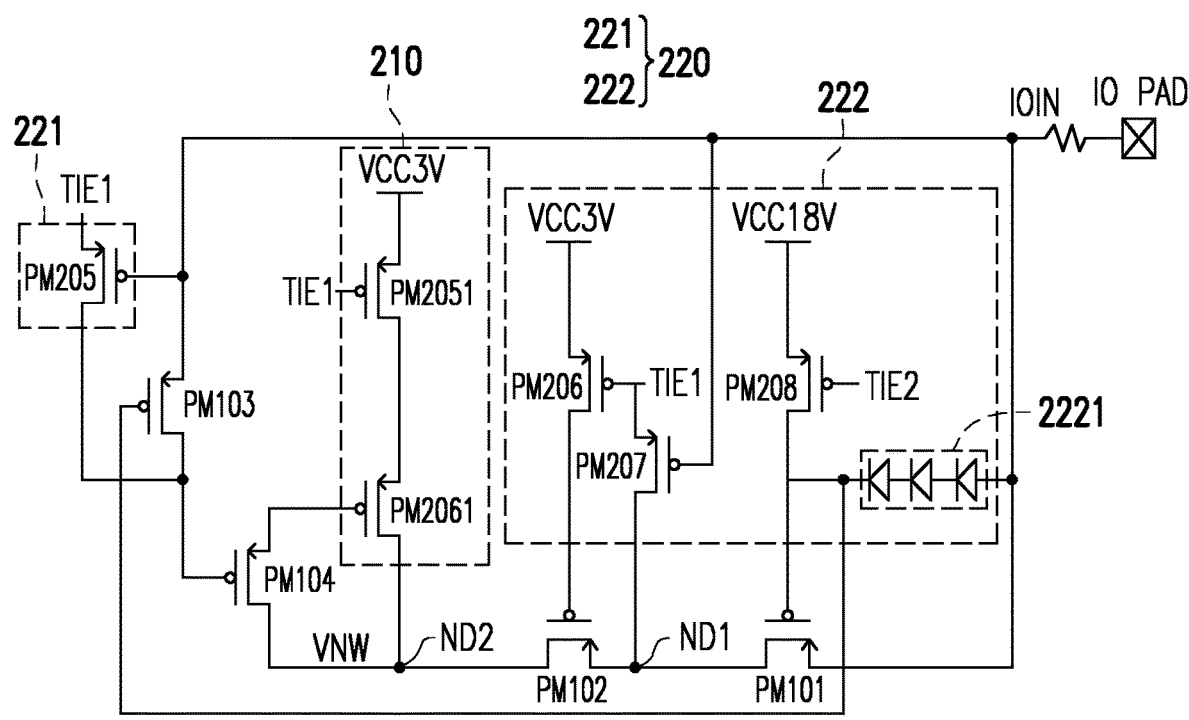
FIG. 2 is a circuit schematic diagram of a self-biased circuit according to another embodiment of the invention.

Referring to FIG. 2, FIG. 2 is a circuit schematic diagram of a self-biased circuit according to another embodiment of the invention. The self-biased circuit 200 includes a tracking circuit 210, a biasing control circuit 220 and transistors PM101-PM04. The biasing control circuit 220 includes a first part circuit 221 and a second part circuit 222.

In the embodiment, the tracking circuit 210 includes transistors PM2051 and PM2061. A first terminal of the transistor PM2051 receives the first power voltage VCC3V, a control terminal of the transistor PM2051 receives a setting signal TIE1, and a second terminal of the transistor PM2051 is coupled to a first terminal of the transistor PM2061. A second terminal of the transistor PM2061 is coupled to a second node ND2, and a control terminal of the transistor PM2061 is coupled to a first terminal of the transistor PM104.

On the other hand, the first part circuit 221 of the biasing control circuit 220 includes a transistor PM205. A first terminal of the transistor PM205 receives the setting signal TIE1, a control terminal of the transistor PM205 is coupled to the pad IOPAD, and a second terminal of the transistor PM205 is coupled to a second terminal of the transistor PM103, and is coupled to a control terminal of the transistor PM104.

The second part circuit 222 of the biasing control circuit 220 includes transistors PM206, PM207 and PM208 and a diode string 2221. A first terminal of the transistor PM206 receives the first power voltage VCC3V, a control terminal of the transistor PM206 is coupled to a first terminal of the transistor PM207, and a second terminal of the transistor PM206 is coupled to the control terminal of the transistor PM102. Moreover, a control terminal of the transistor PM207 is coupled to the pad IOPAD, and a second terminal of the transistor PM207 is coupled to the first node ND1. A first terminal of the transistor PM208 receives the second power voltage VCC18V, a control terminal of the transistor PM208 receives a setting signal TIE2, and a second terminal of the transistor PM208 is coupled to the control terminal of the transistor PM101.

In the embodiment, the diode string 2221 includes one or a plurality of diodes, and is forwardly biased between the pad IOPAD and the second terminal of the transistor PM208. The diode 2221 is used for decreasing the voltage IOIN on the pad IOPAD, and transmitting the decreased voltage to the control terminal of the transistor PM101 and the transistor PM103.

In the embodiment, a voltage value of the first power voltage VCC3V is greater than a voltage value of the second power voltage VCC18V. Under a normal working state, the first power voltage VCC3V is, for example, equal to 3.3 volts, and the second power voltage VCC18V is, for example, equal to 1.8 volts. When the voltage IOIN on the pad IOPAD is 3.3 volts, the self-biased circuit 200 may generate the bias voltage VNW of 3.1 volts. Comparatively, in case of a failure state, the voltage values of the first power voltage VCC3V and the second power voltage VCC18V are gradually decreased to 0 volt, and the self-biased circuit 200 keeps generating the bias voltage VNW of 3.3 volts according to the voltage of 3.3 volts on the pad IOPAD. On the other hand, regarding voltage values of the setting signals TIE1 and TIE2, in the normal working state, when the voltage IOIN on the pad IOPAD is 3.3 volts, the voltage values of the setting signals TIE1 and TIE2 may be respectively 1.8 volts and 0 volt. In the failure state (the voltage values of the first power voltage VCC3V and the second power voltage VCC18V are decreased to 0 volt), the voltage values of the setting signals TIE1 and TIE2 may be respectively 1.8 volts and 1.8 volts.

It should be noted that in the embodiment, the circuit formed by the transistors PM102, PM104, PM2051, PM2061, PM206 and PM207 is configured to generate the bias voltage VNW isolated from the power voltages (including the first power voltage VCC3V and the second power voltage VCC18V) under the failure state, and provide the bias voltage VNW to the bulk of the P-type transistor in the integrated circuit. The transistors PM2051 and PM2061 are configured to resist a leakage path probably generated based on the boosted voltage IOIN on the pad IOPAD under the failure state. Moreover, the transistors PM205, PM103, PM104, PM208 and PM101 and the diode string 2221 are used for generating the control voltages of the above circuits, and maintaining overall reliability of the self-biased circuit 200.

It should be noted that in other embodiments of the invention, the self-biased circuit 200 may also provide the bias voltage to the bulks of the P-type transistors in the integrated circuit through the first node ND1.

Figure 3:
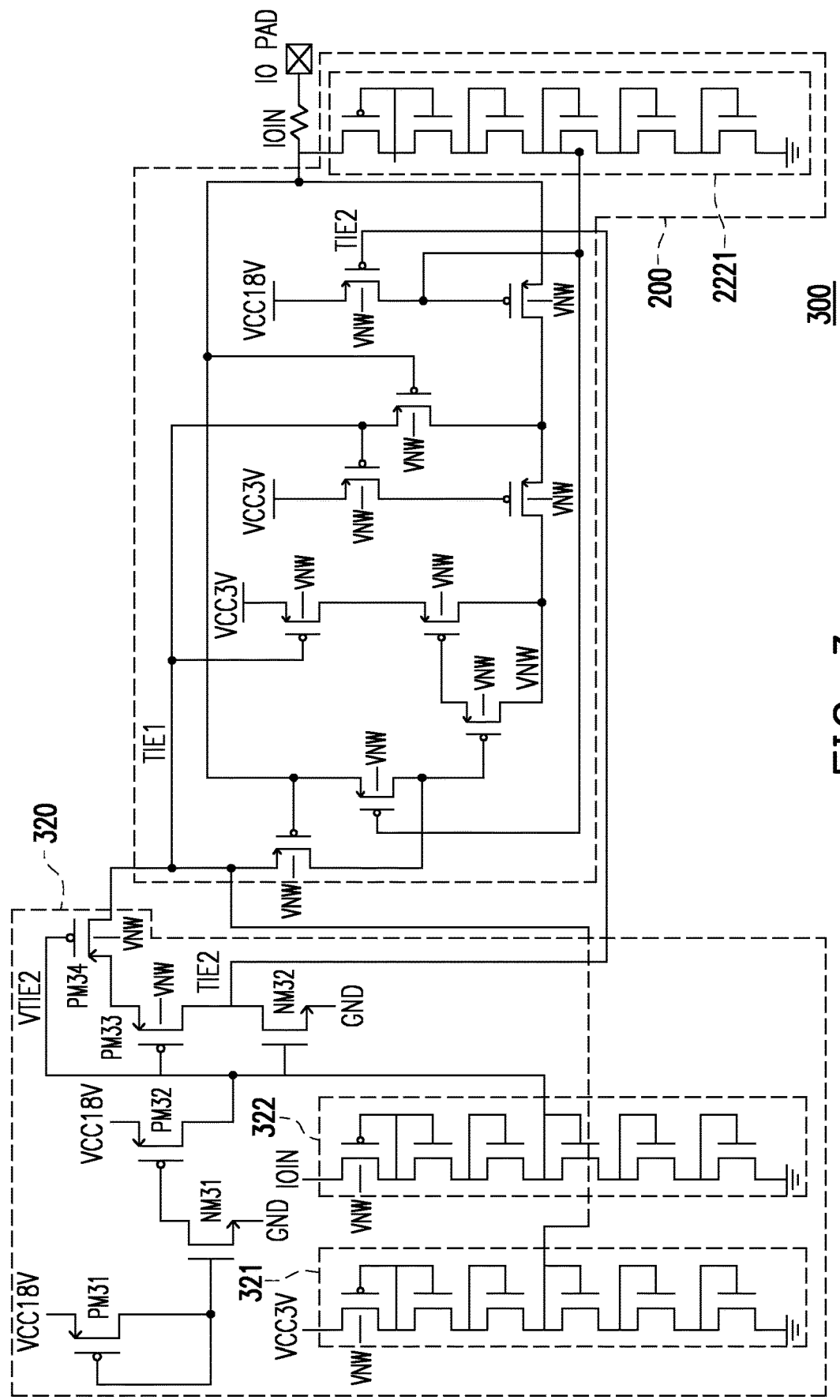
FIG. 3 is a schematic diagram of a self-biased circuit according to another embodiment of the invention.

Referring to FIG. 3, FIG. 3 is a schematic diagram of a self-biased circuit according to another embodiment of the invention. Besides that the self-biased circuit 300 has the circuit framework of the self-biased circuit 200 of the aforementioned embodiment, the self-biased circuit 300 further includes a setting signal generator 320. Moreover, the diode string 2221 in the self-biased circuit 200 of FIG. 3 is composed of a plurality of transistors connected in a diode configuration. Moreover, in the circuit framework of the self-biased circuit 200, the bulk of each of the P-type transistors receives the bias voltage VNW.

On the other hand, the setting signal generator 320 includes diode strings 321, 322 and transistors PM31-PM34 and NM31, NM32. The diode strings 321, 322 are respectively composed of a plurality of transistors connected in a diode configuration. An anode of the diode string 321 receives the first power voltage VCC3V, and a cathode of the diode string 321 generates the setting signal TIE1. An anode of the diode string 322 is coupled to the pad IOPAD and receives the voltage IOIN on the pad IOPAD, and a cathode of the diode string 322 generates a signal VTIE2.

Moreover, a first terminal of the transistor PM31 receives the second power voltage VCC18V, a control terminal and a second terminal of the transistor PM31 are connected to each other to make the transistor PM31 forming the diode configuration, and the second terminal and the control terminal of the transistor PM31 are commonly coupled to a control terminal of the transistor NM31.

A first terminal of the transistor NM31 is coupled to a control terminal of the transistor PM32, a second terminal of the transistor NM31 is coupled to a reference ground terminal GND. A first terminal of the transistor PM32 receives the second power voltage VCC18V, and a second terminal of the transistor PM32 generates the signal VTIE2.

On the other hand, the transistors PM33 and NM 32 are coupled in series to construct an inverter. Control terminals of the transistors PM33 and NM 32 commonly receive the signal VTIE2, and a first terminal of the transistor PM33 is coupled to a second terminal of the transistor PM34, and a second terminal of the transistor NM32 is coupled to the reference ground terminal GND. Coupling terminals of the transistors PM33 and NM 32 generate the setting signal TIE2. A control terminal of the transistor PM34 receives the signal VTIE2, and the second terminal of the transistor PM34 is coupled to a terminal of the diode string 321 generating the setting signal TIE1.

Under the normal working state, the control terminal of the transistor NM31 receives a high voltage (equal to the second power voltage VCC18V minus a conduction voltage of the transistor PM31), and is accordingly turned on. In this way, a voltage on the control terminal of the transistor PM32 is pulled low, and the transistor PM32 is correspondingly turned on, and a voltage of the signal VTIE2 is pulled high. Therefore, through the turned on transistor NM32, the setting signal TIE2 substantially equal to 0 volt is generated. On the other hand, the diode string 321 may generate the setting signal TIE1 of 1.8 volts according to the first power voltage VCC3V of a normal voltage value (for example, 3.3 volts).

Under the failure state, the first power voltage VCC3V and the second power voltage VCC18V are all decreased to 0 volt, and the diode string 321 cannot generate the effective setting signal TIE1, and the transistors PM31, NM31 and PM32 cannot be effectively turned on. In this case, the diode string 322 may provide the signal VTIE2 with a voltage value slightly lower than the voltage IOIN according to the pulled-up voltage IOIN on the pad IOPAD. In this way, the transistors PM34, PM33 and NM32 may generate the setting signals TIE1 and TIE2 equal to, for example, 1.8 volts.

Figure 4A:
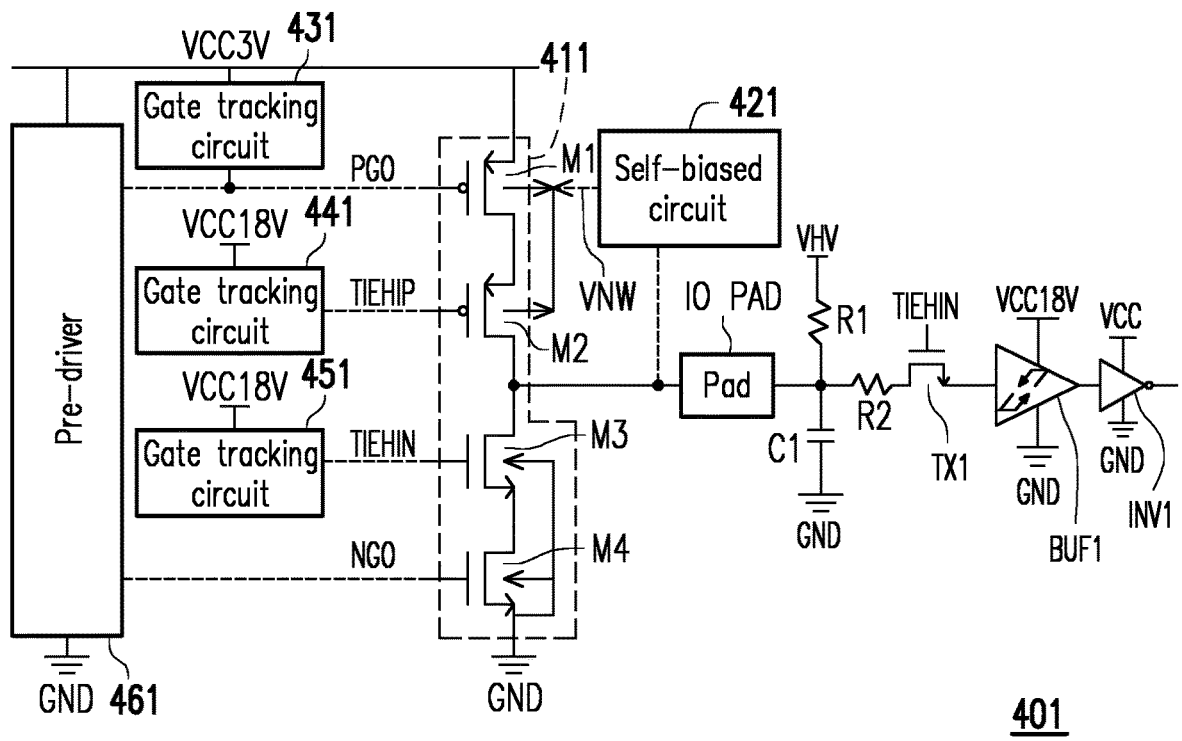
FIG. 4A and FIG. 4B are schematic diagrams of input and output circuits of different embodiments of the invention.
Figure 4B:
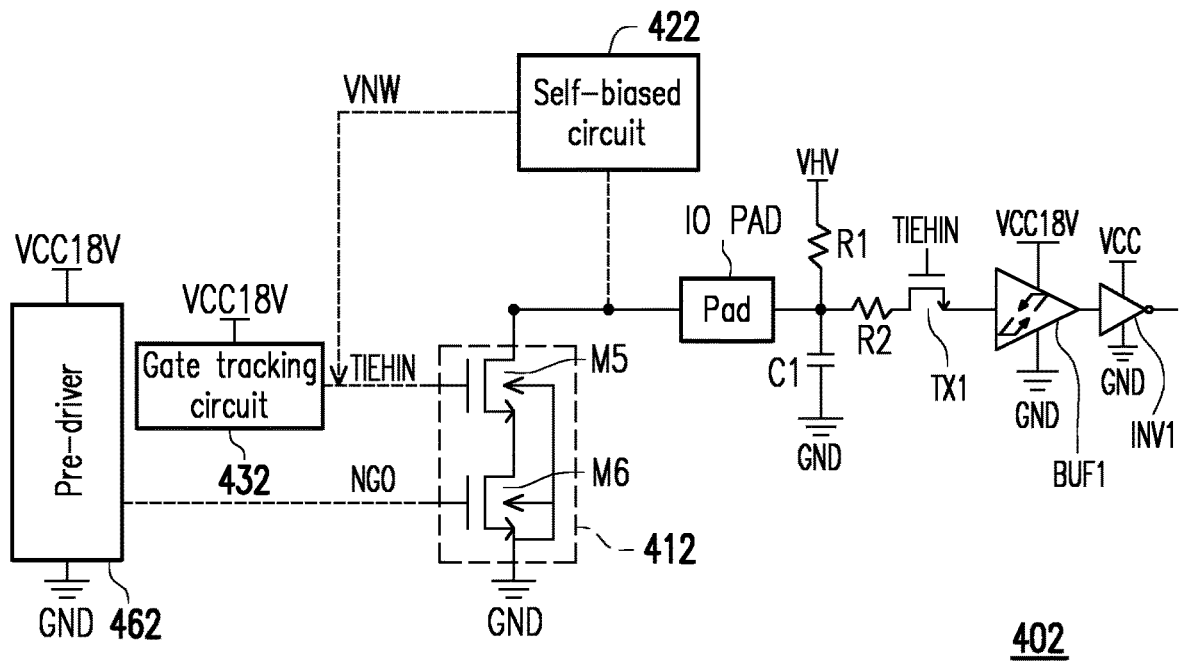

Referring to FIG. 4A and FIG. 4B, FIG. 4A and FIG. 4B are schematic diagrams of input and output circuits of different embodiments of the invention. In FIG. 4A, the input and output circuit 401 includes an input output buffer 411 and a self-biased circuit 421. The input output buffer 411 is coupled to the pad IOPAD, and has a plurality of stacked transistors M1-M4. The self-biased circuit 421 is coupled to the pad IOPAD and the input output buffer 411. The self-biased circuit 421 generates the bias voltage VNW, and provides the bias voltage VNW to bulks of the transistors M1-M2 in the input output buffer 411.

In the embodiment, the self-biased circuit 421 may be implemented according to the self-biased circuits 100, 200 and 300 of the aforementioned embodiments. Under the failure state, the self-biased circuit 421 may generate and provide the bias voltage VNW to the bulks of the transistors M1-M2 according to the voltage on the pad IOPAD, and provide corresponding bias points to effectively control driving signals PG0, TIEHIP and TIEHIN, so as to complete the fail-safe operation.

In the embodiment, the input output circuit 401 further includes gate tracking circuits 431, 441 and 451, a pre-driver 461, resistors R1 and R2, a capacitor C1, a transistor TX1 and buffers BUF1 and INV1. The gate tracking circuit 431 receives the first power voltage VCC3V, and the gate tracking circuits 441 and 451 receive the second power voltage VCC18V. The gate tracking circuit 431 and the pre-driver 461 generate the driving signal PGO to drive the transistor M1; the gate tracking circuits 441 and 451 respectively generate the driving signals TIEHIP and TIEHIN to respectively drive the transistors M2 and M3; and the pre-driver 461 generates a driving signal NGO to drive the transistor M4. In the embodiment, the gate tracking circuits 431, 441 and 451 may be implemented by the gate tracking circuits well known by those skilled in the art, which is not specifically limited.

The resistors R1 and R2 and the capacitor C1 form an RC network, where the resistor R1 receives a voltage VHV to, for example, pull up the voltage on the pad IOPAD. The transistor TX1 and the buffers BUF1 and INV1 form a buffer circuit to transmit the voltage on the pad IOPAD to the internal of the integrated circuit. The buffer BUF1 may be a delay buffer, and the buffer INV1 may be an inverter. It should be noted that a working power received by the buffer BUF1 is the second power voltage VCC18V, and the buffer INV1 receives a power supply VCC to serve as the working power, a control terminal of the transistor TX1 receives the driving signal TIEHIN. A voltage of the power supply VCC may be equal to or smaller than a voltage of the second power voltage VCC18V.

In FIG. 4B, the input and output circuit 402 includes an input output buffer 412 and a self-biased circuit 422. The input output buffer 412 is coupled to the pad IOPAD, and has a plurality of stacked transistors M5-M6. The self-biased circuit 422 is coupled to the pad IOPAD and the input output buffer 412. The self-biased circuit 422 generates the bias voltage VNW, and provides the bias voltage VNW to a gate tracking circuit 432 to effectively control a control terminal of the transistor M5 in the input output buffer 412.

The input and output circuit 402 further includes the gate tracking circuit 432, a pre-driver 462, resistors R1 and R2, a capacitor C1, a transistor TX and buffers BUF1 and INV1. The gate tracking circuit 431 receives the first power voltage VCC3V, and the gate tracking circuits 441 and 451 receive the second power voltage VCC18V.

It should be noted that the pre-driver 462 generates the driving signal NGO to drive the transistor M6. The gate tracking circuit 432 generates the driving signal TIEHIN to drive the transistor M5 under the normal working state. Comparatively, under the failure state, the self-biased circuit 422 generates the bias voltage VNW, and provides the bias voltage VNW to drive the transistor M5, so as to achieve the requirement of fail-safe.

In summary, the invention provides the self-biased circuit to generate the bias voltage according to the first power voltage decreased to 0 volt and based on the pulled-up voltage on the pad under the failure state. The bias voltage is provided to the bulk formed at the N-well in the P-type transistor of the integrated circuit, so as to achieve the requirement of the fail-safe of the integrated circuit.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A self-biased circuit, comprising:
   a tracking circuit, receiving a first power voltage, and generating a bias voltage according to a variation of the first power voltage;
   a biasing control circuit, coupled to a pad and receiving the first power voltage, and generating a first control signal, a second control signal and a third control signal according to the first power voltage and a voltage on the pad;
   a first transistor, coupled between the pad and a first node, and controlled by the first control signal;
   a second transistor, coupled between the first node and a second node, and controlled by the second control signal, wherein the second node provides the bias voltage;

a third transistor, having a first terminal coupled to the pad, a control terminal of the third transistor receiving the third control signal, and the third transistor generating a fourth control signal at a second terminal of the third transistor according to the voltage on the pad and the third control signal; and a fourth transistor, coupled between the tracking circuit and the second node, and the fourth transistor generating the bias voltage on the second node according to the fourth control signal.

2. The self-biased circuit as claimed in claim 1, wherein bulks of the first transistor to the fourth transistor receive the bias voltage.

3. The self-biased circuit as claimed in claim 1, wherein the tracking circuit comprises:

a fifth transistor, having a first terminal receiving the first power voltage, and a control terminal of the fifth transistor receiving a first setting signal; and a sixth transistor, having a first terminal coupled to a second terminal of the fifth transistor, a control terminal of the sixth transistor coupled to a first terminal of the fourth transistor, and a second terminal of the sixth transistor coupled to the second node.

4. The self-biased circuit as claimed in claim 3, wherein the first transistor to the sixth transistor are all P-type transistors, and bulks of the fifth transistor and the sixth transistor receive the bias voltage, and the bulks of the fifth transistor and the sixth transistor are isolated from the first power voltage.

5. The self-biased circuit as claimed in claim 1, wherein the biasing control circuit comprises:

a fifth transistor, having a first terminal receiving a first setting signal, a control terminal of the fifth transistor coupled to the pad and coupled to the first terminal of the third transistor, and a second terminal of the fifth transistor coupled to the second terminal of the third transistor;

a sixth transistor, having a first terminal receiving the first power voltage, and a second terminal of the sixth transistor coupled to the control terminal of the second transistor;

a seventh transistor, having a first terminal coupled to a control terminal of the sixth transistor and receiving the first setting signal, a control terminal of the seventh transistor coupled to the pad, and a second terminal of the seventh transistor coupled to the first node;

a first diode string, forwardly biased between the pad and a control terminal of the first transistor; and an eighth transistor, having a first terminal receiving a second power voltage, a control terminal of the eighth transistor receiving a second setting signal, and a second terminal of the eighth transistor coupled to the control terminal of the first transistor, wherein the first power voltage is greater than the second power voltage.

6. The self-biased circuit as claimed in claim 5, wherein the fifth transistor to the eighth transistor are all P-type transistors, and bulks of the fifth transistor to the eighth transistor receive the bias voltage, and the bulks of the fifth transistor to the eighth transistor are isolated from the first power voltage and the second power voltage.

7. The self-biased circuit as claimed in claim 5, wherein the first diode string comprises at least one diode, an anode of the at least one diode is coupled to the pad, and a cathode of the at least one diode is coupled to the control terminal of the first transistor.

8. The self-biased circuit as claimed in claim 5, further comprising:

a setting signal generator, coupled to the tracking circuit and the biasing control circuit, and configured to generate the first setting signal and the second setting signal.

9. The self-biased circuit as claimed in claim 8, wherein the setting signal generator comprises:

a second diode string, having an anode receiving the first power voltage, and a cathode coupled to the first terminal of the fifth transistor;

a ninth transistor, having a first terminal receiving the second power voltage, and a second terminal of the ninth transistor coupled to a control terminal of the ninth transistor;

a tenth transistor, having a control terminal coupled to the second terminal of the ninth transistor, and a second terminal of the tenth transistor coupled to a reference ground terminal;

an eleventh transistor, having a control terminal coupled to a first terminal of the tenth transistor, and a first terminal of the eleventh transistor receiving the second power voltage;

a third diode string, having an anode coupled to the pad, and a cathode of the third diode string coupled to a second terminal of the eleventh transistor;

a twelfth transistor, having a control terminal coupled to the second terminal of the eleventh transistor, and a second terminal coupled to the first terminal of the fifth transistor;

a thirteenth transistor; and a fourteenth transistor, connected in series with the thirteenth transistor between a first terminal of the twelfth transistor and the reference ground terminal, and a control terminal of the fourteenth transistor and a control terminal of the thirteenth transistor commonly coupled to the second terminal of the eleventh transistor, wherein the second terminal of the twelfth transistor provides the first setting signal, and a coupling terminal of the thirteenth transistor and the fourteenth transistor provides the second setting signal.

10. The self-biased circuit as claimed in claim 9, wherein bulks of the twelfth transistor and the thirteenth transistor receive the bias voltage.

11. An input and output circuit, comprising:

an input output buffer, having a plurality of stacked transistors;

the self-biased circuit as claimed in claim 1, providing the bias voltage to bulks or control terminals of a part of the stacked transistors.

* * * * *